US012654263B2

(12) United States Patent
Iyama et al.

(10) Patent No.: US 12,654,263 B2
(45) Date of Patent: Jun. 16, 2026

(54) METHOD OF MANUFACTURING SEMICONDUCTOR DEVICE AND JIG SET

(71) Applicant: FUJI ELECTRIC CO., LTD., Kawasaki (JP)

(72) Inventors: Koichiro Iyama, Matsumoto City (JP); Takashi Akahane, Matsumoto City (JP); Yoshiaki Takahashi, Matsumoto City (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 19/091,611

(22) Filed: Mar. 26, 2025

(65) Prior Publication Data

US 2025/0319554 A1     Oct. 16, 2025

(30) Foreign Application Priority Data

Apr. 16, 2024     (JP) ................................ 2024-066103

(51) Int. Cl.
B23P 15/26 (2006.01)
H05K 3/00 (2006.01)

(52) U.S. Cl.
CPC ................ B23P 15/26 (2013.01); H05K 3/00 (2013.01); H05K 2203/0165 (2013.01)

(58) Field of Classification Search
CPC ............ B23P 15/26; B23P 15/00; H05K 3/00; H05K 2203/0165; H05K 2203/0147; H05K 2203/01; H05K 2203/00
USPC ................................ 29/890.035, 890.03, 592
See application file for complete search history.

(56) References Cited

U.S. PATENT DOCUMENTS

| | | | | |
|---|---|---|---|---|
| 8,987,063 B2 * | 3/2015 | Harata | ................... | H01L 24/48 |
| | | | | 257/787 |
| 9,147,665 B2 * | 9/2015 | Zhu | .................... | H01L 23/49513 |
| 10,861,741 B2 * | 12/2020 | Wachtler | ............. | H01L 23/4985 |
| 11,538,717 B2 * | 12/2022 | Wachtler | ................ | H01L 23/04 |
| 12,303,990 B2 * | 5/2025 | Guo | .................... | B23K 1/0016 |
| 2010/0097431 A1 * | 4/2010 | Takakuwa | ............ | B41J 2/14233 |
| | | | | 347/68 |
| 2011/0037153 A1 * | 2/2011 | Zhu | ........................ | H01L 24/83 |
| | | | | 257/676 |

(Continued)

FOREIGN PATENT DOCUMENTS

| | | |
|---|---|---|
| JP | 2008-147218 A | 6/2008 |
| JP | 2013-157377 A | 8/2013 |

(Continued)

*Primary Examiner* — Lawrence Averick
(74) *Attorney, Agent, or Firm* — Rabin & Berdo, P.C.

(57) ABSTRACT

A jig set for placing an insulated circuit board on a cooling surface of a cooling unit, and a method for placing the insulated circuit board on the cooling surface using the jet set. The jig set includes: a positioning jig configured to be disposed on the cooling surface, and having an opening corresponding to a size of the insulated circuit board in a plan view, to thereby define a fixing area for housing the insulated circuit board therein; a height control jig including a control part shaped to be fitted into the fixing area of the positioning jig, the control part having, at a lower end thereof, a pressing surface for pressing an upper surface of the insulated circuit board located in the fixing area toward the cooling surface; and a positioning weight configured to apply, to the positioning jig, a pressure toward the cooling surface.

5 Claims, 11 Drawing Sheets

(56)                    References Cited

U.S. PATENT DOCUMENTS

| | | | |
|---|---|---|---|
| 2012/0208324 A1* | 8/2012 | Harata .................... | H01L 23/28 |
| | | | 438/123 |
| 2019/0164807 A1* | 5/2019 | Wachtler ........... | H01L 23/49513 |
| 2021/0090940 A1* | 3/2021 | Wachtler ........... | H01L 23/49827 |
| 2023/0115598 A1* | 4/2023 | Takahashi ........... | H01L 23/3142 |
| | | | 257/676 |
| 2023/0154889 A1* | 5/2023 | Ishikawa ................ | H01L 24/77 |
| | | | 438/529 |
| 2024/0269759 A1* | 8/2024 | Guo ....................... | H05K 3/363 |

FOREIGN PATENT DOCUMENTS

| | | |
|---|---|---|
| JP | 2022-139492 A | 9/2022 |
| JP | 2023-074141 A | 5/2023 |

* cited by examiner

4

< AFTER PROCESS P3b >

<AFTER PROCESS P3c>

<AFTER PROCESS P3d>

<BEFORE SOLDERING>

<AFTER SOLDERING>

<AFTER SOLDERING>

METHOD OF MANUFACTURING SEMICONDUCTOR DEVICE AND JIG SET

CROSS-REFERENCE TO RELATED APPLICATION

This application is based upon and claims the benefit of priority of the prior Japanese Patent Application No. 2024-066103, filed on Apr. 16, 2024, the entire contents of which are incorporated herein by reference.

BACKGROUND OF THE INVENTION

1. Field of the Invention

The embodiment discussed herein relates to a method of manufacturing a semiconductor device and a jig set.

2. Background of the Related Art

When manufacturing a semiconductor device, a positioning jig is used to bond a semiconductor chip to a predetermined area on an insulated circuit board and also to bond the insulated circuit board to a predetermined area on a heat dissipating plate. A weight may also be placed on a positioning jig (see, for example, Japanese Laid-open Patent Publication Nos. 2023-074141 and 2022-139492).

As one example of how a jig is used during manufacturing, a curved pressing member applies pressure via an inner block to an insulating substrate on which conductive patterns are provided, and the insulating substrate with the conductive patterns and a copper base are soldered together (see, for example, Japanese Laid-open Patent Publication No. 2013-157377). It is also possible to use a jig to support outer surfaces of both metal plates in a multilayer structure during soldering (see, for example, Japanese Laid-open Patent Publication No. 2008-147218).

SUMMARY OF THE INVENTION

According to an aspect of the present disclosure, there is provided a method of manufacturing a semiconductor device, including: preparing an insulated circuit board having a first surface and a second surface opposite to each other, and a cooling unit including a cooling surface; preparing a jig set including a positioning jig having an opening that corresponds to a size of the insulated circuit board in a plan view of the semiconductor device, to thereby define a fixing area for housing the insulated circuit board therein, and a height control jig including a control part shaped to be fitted into the fixing area of the positioning jig, the control part having, at a lower end thereof, a pressing surface; housing the entire insulated circuit board in the fixing area of the positioning jig, setting a bonding member on the first surface of the insulated circuit board, and disposing the positioning jig on the cooling surface of the cooling unit; and pressing the height control jig to thereby press the second surface of the insulated circuit board housed in the fixing area toward the cooling surface, while pressing the positioning jig onto the cooling surface.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
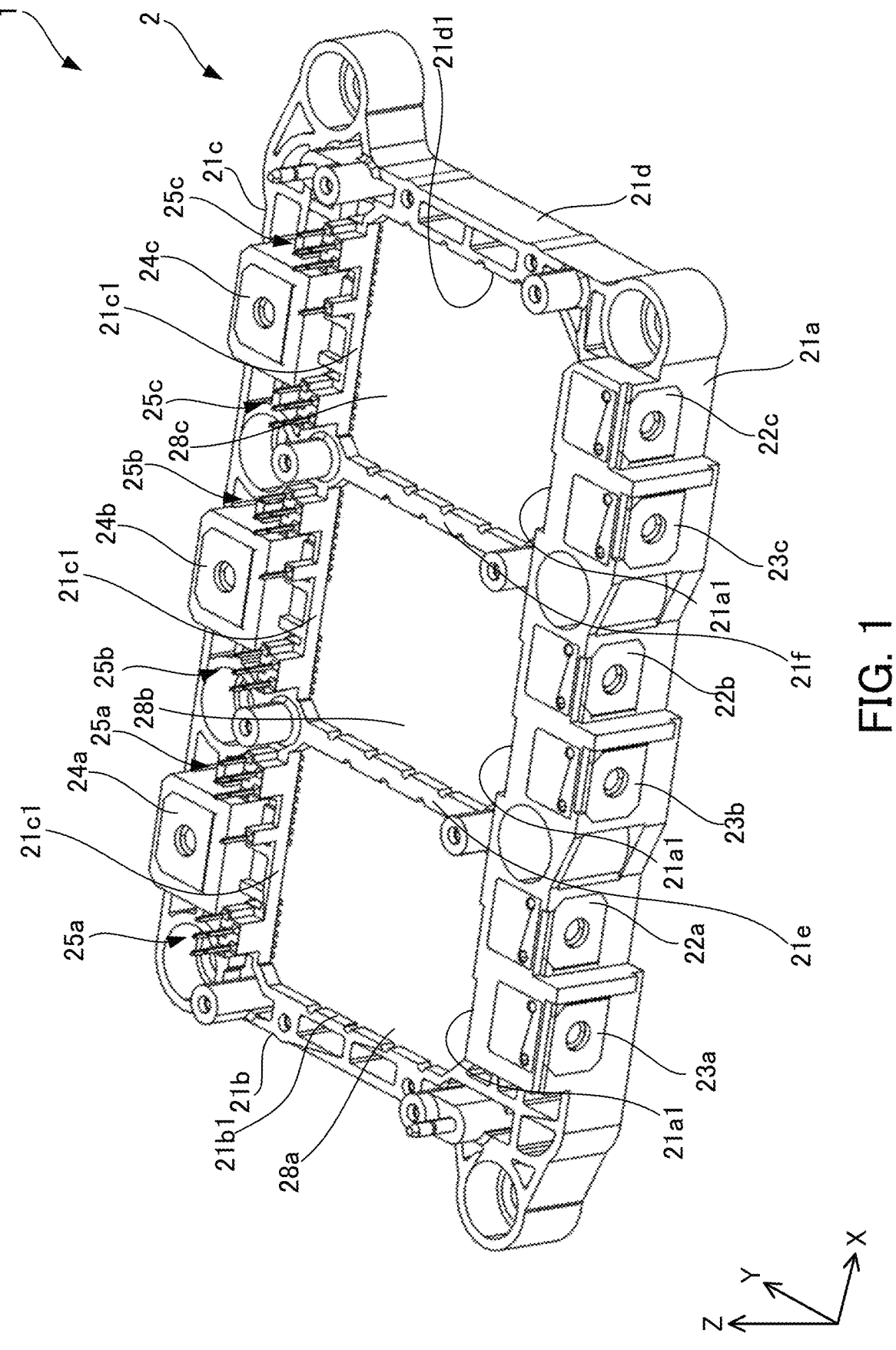
FIG. 1 is a perspective view of a semiconductor device.

FIG. 1 is a perspective view of a semiconductor device.

An embodiment will now be described with reference to the drawings. In the present embodiment, the expression "front (or "upward-facing") surface" refers to a surface (or orientation) of the semiconductor device 1 that faces upward in FIG. 1. As one example, encapsulating surfaces of encapsulating members 28a, 28b, and 28c, which encapsulate housing areas surrounded by inner walls 21a1, 21b1, 21c1, and 21d1 of a case 2, correspond to a front (or upward-facing) surface. The expression "rear (or "downward-facing") surface" refers to a surface (or orientation) of the semiconductor device 1 that faces downward in FIG. 1. This corresponds for example to the rear (or downward-facing) surface of the case 2. For drawings aside from FIG. 1, the expressions "front (or upward-facing) surface" and "rear (or downward-facing) surface" refer to the same orientations.

A semiconductor device 1 according to the present embodiment will now be described with reference to FIG. 1. FIG. 1 is a perspective view of the semiconductor device 1 according to the first embodiment. Note that in FIG. 1, only main components have been assigned reference numerals. Although not illustrated, an output side area, an intermediate area, and an input side area are set on the respective encapsulating surfaces of the encapsulating members 28a, 28b, and 28c.

As depicted in FIG. 1, the semiconductor device includes semiconductor units (not illustrated), a case 2 for housing the semiconductor units, and a cooling unit 3 (not depicted in FIG. 1, so refer to FIG. 4) on which the semiconductor units are disposed and which is provided on the rear surface of the case 2. Note that the semiconductor units will be described in detail later. The case 2 is substantially rectangular in shape in plan view and includes long sides 21a and 21c and short sides 21b and 21d. The case 2 is provided with the inner walls 21a1 and 21c1 along the long sides 21a and 21c. The inner walls 21a1 and 21c1 are divided by partitions 21e and 21f. These partitions 21e and 21f are provided in parallel to the short sides 21b and 21d and are perpendicular to the long sides 21a and 21c. Three housing areas surrounded by the inner walls 21a1, 21b1, 21c1, and 21d1 each house a semiconductor unit, and are encapsulated by the encapsulating members 28a, 28b, and 28c, respectively.

The encapsulating members 28a, 28b, and 28c encapsulate the semiconductor units disposed in the three housing areas surrounded by the inner walls 21a1, 21b1, 21c1, and 21d1. The encapsulating members 28a, 28b, and 28c are made of a thermosetting resin in which a filler has been mixed. Examples of the thermosetting resin include epoxy resin, phenol resin, maleimide resin, and polyester resin. The filler is ceramics with insulating properties and high thermal conductivity. Examples of the filler include silicon oxide, aluminum oxide, boron nitride, and aluminum nitride. The content of the filler may be 10% by volume or greater and 70% by volume or lower with respect to the encapsulating members 28a, 28b, and 28c as a whole.

The case 2 is also provided with positive electrode terminals 22a, 22b, and 22c and negative electrode terminals 23a, 23b, and 23c along the long side 21a. The case 2 is also provided with a U terminal 24a, a V terminal 24b, and a W terminal 24c on the front surface of the case 2 along the long side 21c. The encapsulating member 28a is interposed between the positive electrode terminal 22a and the negative electrode terminal 23a on one side and the U terminal 24a on the other. In addition, the case 2 is provided with a control terminal 25a between the U terminal 24a and the inner wall 21c1 that is adjacent to the encapsulating member 28a. The encapsulating member 28b is interposed between the positive and negative electrode terminals 22b and 23b on one side and the V terminal 24b on the other. The case 2 is also provided with a control terminal 25b between the inner wall 21c1, which is adjacent to the encapsulating member 28b, and the V terminal 24b. The encapsulating member 28c is interposed between the positive and negative electrode terminals 22c and 23c on one side and the W terminal 24c on the other. The case 2 is also provided with a control terminal 25c between the inner wall 21c1, which is adjacent to the encapsulating member 28c, and the W terminal 24c. Note that the other ends of such control terminals 25a, 25b, and 25c are respectively electrically connected to the gate electrodes of the semiconductor chips of the semiconductor units housed inside the case 2. These other ends of the U terminal 24a, the V terminal 24b, and the W terminal 24c are electrically connected to the emitter electrodes (or source electrodes) of the semiconductor chips of the semiconductor units.

Figure 2:
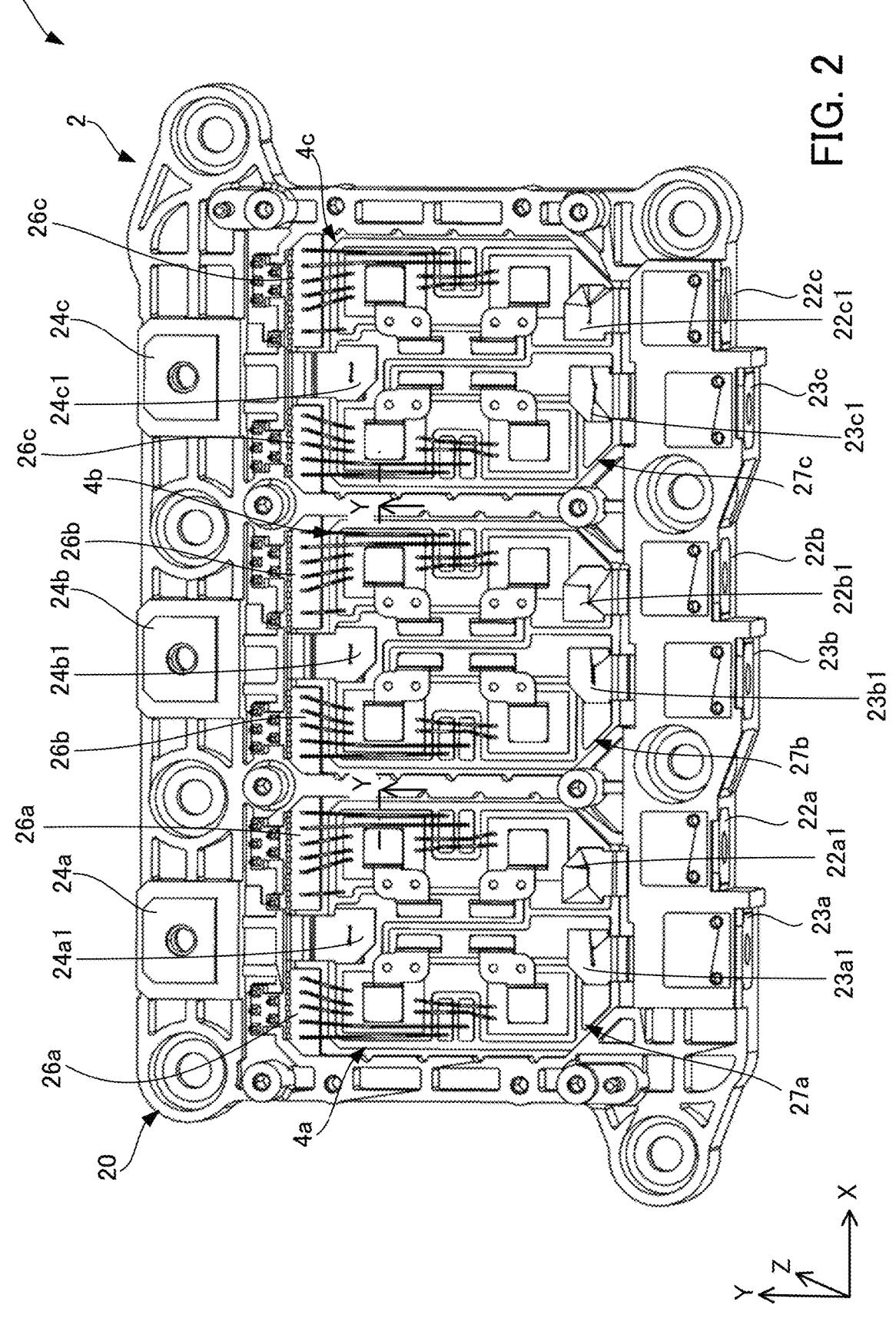
FIG. 2 is a plan view of the semiconductor device.

FIG. 2 is a plan view of the semiconductor device. The case 2 includes the frame 20, the positive electrode terminals 22a, 22b, and 22c, the negative electrode terminals 23a, 23b, and 23c, the U, V, and W terminals 24a, 24b, and 24c, the control terminals 25a, 25b, and 25c, and printed circuit boards 26a, 26b, and 26c attached to the frame 20, the housing areas 27a, 27b, and 27c, and the semiconductor units 4a, 4b, and 4c. However, the reference numerals for the control terminals 25a, 25b, and 25c are omitted from FIG. 2.

The frame 20 is shaped as a flat plate. The housing areas 27a, 27b, and 27c are housing areas surrounded by inner walls 21a1, 21b1, 21c1, and 21d1. The housing areas 27a, 27b, and 27c house the semiconductor units 4a, 4b, and 4c, respectively. The shapes of the housing areas 27a, 27b, and 27c in plan view correspond to the shapes of insulated circuit boards of the semiconductor units 4a, 4b, and 4c, which will be described later. In the present embodiment, the housing areas 27a, 27b, and 27c are configured so that one of the inner wall surfaces (for example, an inner wall surface of the inner wall 21a1) is shorter than the other inner wall surfaces (for example, the inner wall surface of the inner wall 21b1). The present embodiment is not limited to this, and the housing areas 27a, 27b, and 27c may be substantially rectangular.

The frame 20 is formed by injection molding where the positive electrode terminals 22a, 22b, and 22c, the negative electrode terminals 23a, 23b, and 23c, the U, V, and W terminals 24a, 24b, and 24c, the control terminals 25a, 25b, and 25c, and the printed circuit boards 26a, 26b, and 26c are set in a predetermined mold and a thermoplastic resin containing a filler is injected. Example resins include polyphenylene sulfide (PPS) resin, polybutylene terephthalate (PBT) resin, polybutylene succinate (PBS) resin, polyamide (PA) resin, and acrylonitrile butadiene styrene (ABS) resin. The filler is silicon oxide, aluminum oxide, boron nitride, or aluminum nitride. As a specific example, the frame 20 is made of PPS resin containing any of the fillers mentioned above.

The positive electrode terminals 22a, 22b, and 22c are integrally molded along the long side 21a of the frame 20 so as to correspond to the housing areas 27a, 27b, and 27c (the inner walls 21a1), respectively. The positive electrode terminals 22a, 22b, and 22c respectively have internal connector portions 22a1, 22b1, and 22c1 at their ends. The internal connector portions 22a1, 22b1, and 22c1 are shaped as a flat plate and protrude from the inner walls 21a1 into the housing areas 27a, 27b, and 27c, respectively, in parallel to the inner walls 21b1 and 21d1.

The negative electrode terminals 23a, 23b, and 23c are integrally molded along the long side 21a of the frame 20 so as to correspond to the housing areas 27a, 27b, and 27c (the inner walls 21a1), respectively. The negative electrode terminals 23a, 23b, and 23c are adjacent to the positive electrode terminals 22a, 22b, and 22c, respectively, and protrude outward beyond the positive electrode terminals 22a, 22b, and 22c. The negative electrode terminals 23a, 23b, and 23c respectively have internal terminals 23a1, 23b1, and 23c1 at their ends. The internal terminals 23a1, 23b1, 23c1 are shaped as a flat plate and protrude from the inner walls 21a1 into the housing areas 27a, 27b, and 27c, respectively, in parallel to the inner walls 21b1 and 21d1. The internal terminals 23a1, 23b1, and 23c1 are also adjacent to the internal connector portions 22b1, 22a1, and 22c1, respectively.

The U, V, and W terminals 24a, 24b, and 24c are integrally formed on the front surface of the frame 20 along the long side 21c, corresponding to the housing areas 27a, 27b, and 27c (the inner walls 21c1), respectively. The U, V, and W terminals 24a, 24b, and 24c respectively have U, V, and W connector portions 24a1, 24b1, and 24c1 at their ends. The U, V, and W connector portions 24a1, 24b1, and 24c1 are shaped as a flat plate and protrude from approximately the centers of the inner walls 21c1 into the housing areas 27a, 27b, and 27c, respectively, in parallel to the inner walls 21b1 and 21d1. The U, V, and W connector portions 24a1, 24b1, and 24c1 face the internal terminals 23a1, 23b1, and 23c1, respectively, with the housing areas 27a, 27b, 2 and 27c interposed in between.

The control terminals 25a, 25b, and 25c are each rod-shaped and are circular or rectangular in cross section. A plurality of these control terminals 25a, 25b, and 25c are formed on the front surface of the frame 20 along the inner walls 21c1 of the housing areas 27a, 27b, and 27c so as to extend upward in the vicinity of the inner walls 21c1.

Note that the positive electrode terminals 22a, 22b, and 22c, the negative electrode terminals 23a, 23b, and 23c, the U, V, and W terminals 24a, 24b, and 24c, and the control terminals 25a, 25b, and 25c are made of materials with superior electrical conductivity. Example materials include copper, aluminum, or an alloy containing at least one of these metals. In addition, to improve corrosion resistance, a material such as nickel may be formed by plating or the like on the surfaces of the positive electrode terminals 22a, 22b, and 22c, the negative electrode terminals 23a, 23b, and 23c, the U, V, and W terminals 24a, 24b, and 24c, and the control terminals 25a, 25b, and 25c. As specific examples, aside from nickel, nickel-phosphorus alloy and nickel-boron alloy may be used.

The printed circuit boards 26a, 26b, and 26c are shaped as a flat plate and are provided in the housing areas 27a, 27b, and 27c at corners of the housing areas 27a, 27b, and 27c on the inner walls 21c1 respectively corresponding to the U, V, and W connector portions 24a1, 24b1, and 24c1. The printed circuit boards 26a, 26b, and 26c each have a multilayer structure in which an insulating layer and a circuit layer made of an electrically conductive material laminated on the insulating layer are stacked. The insulating layer has glass epoxy resin or phenol resin as a main component. As one example, the conductive material of the circuit layer has copper as a main component. The surfaces of the printed circuit boards 26a, 26b, and 26c are further covered with a resist film material that has high heat resistance, and a plurality of electrodes, which are electrically connected to the circuit layer, are laid out on the front surface. The printed circuit boards 26a, 26b, and 26c are formed with a plurality of through holes into which the control terminals 25a, 25b, and 25c are respectively inserted. When doing so, the control terminals 25a, 25b, and 25c are fixed to the through holes by soldering so as to become electrically connected to the printed circuit boards 26a, 26b, and 26c. Alternatively, the control terminals 25a, 25b, and 25c may be press-fitted into the through holes. The control terminals 25a, 25b, and 25c are inserted into the through holes in the frame 20. These printed circuit boards 26a, 26b, and 26c are also integrally molded with the frame 20.

The semiconductor unit 4a and the printed circuit boards 26a housed in the case 2 are wired together with bonding wires. On the inner wall 21c1 of the case 2 where the semiconductor unit 4a is housed, gate electrodes of the semiconductor chips of the semiconductor unit 4a and the printed circuit board 26a are electrically connected by bonding wires. In the same way, on the inner wall 21c1 of the case 2 where the semiconductor unit 4b is housed, the printed circuit boards 26b and the gate electrodes of the semiconductor unit 4b are electrically connected by bonding wires. Additionally, the printed circuit boards 26c and the gate electrodes of the semiconductor unit 4c are also electrically connected by bonding wires.

Figure 3:
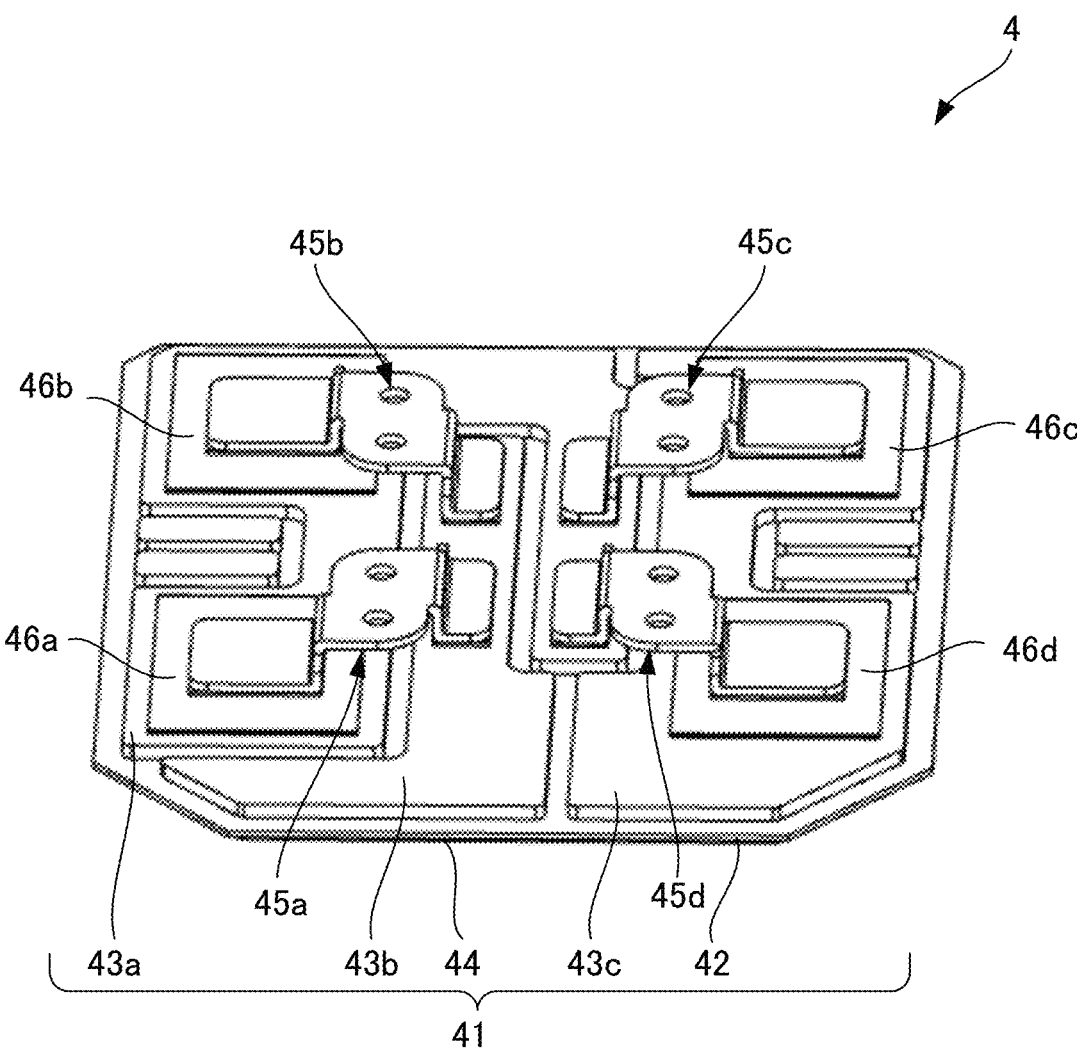
FIG. 3 is a perspective view of a semiconductor unit included in the semiconductor device.
Figure 3:
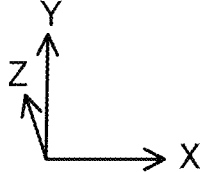

Next, the semiconductor units 4a, 4b, and 4c will be described. FIG. 3 is a perspective view of a semiconductor unit included in the semiconductor device. The semiconductor unit 4 includes an insulated circuit board 41, lead frames 45a, 45b, 45c, and 45d, which are disposed via a predetermined bonding member on the front surface of the insulated circuit board 41, and semiconductor chips 46a, 46b, 46c, and 46d. The semiconductor units 4a, 4b, and 4c have the same structure as the semiconductor unit 4 described here.

The insulated circuit board 41 includes an insulating plate 42, conductive circuit patterns 43a, 43b, and 43c provided on a front surface of the insulating plate 42, and a metal plate 44 provided on a rear surface of the insulating plate 42. The insulating plate 42 and the metal plate 44 may have R- or C-chamfered corners. In plan view, the metal plate 44 is smaller in size than the insulating plate 42 and is formed inside the insulating plate 42. The insulating plate 42 is made of a material with insulating properties, low thermal resistance, and superior thermal conductivity. This insulating plate 42 is made of ceramics. Example ceramics include aluminum oxide, aluminum nitride, and silicon nitride.

The conductive circuit patterns 43a, 43b, and 43c are made of a material with superior electrical conductivity. Example materials include copper, aluminum, or an alloy containing at least one of these metals. The conductive circuit patterns 43a, 43b, and 43c may be subjected to a plating using a material with superior corrosion resistance, such as nickel or an alloy containing nickel. As specific examples, aside from nickel, nickel-phosphorus alloy or nickel-boron alloy may be used. Note that the number, disposed positions, and shapes of the conductive circuit patterns 43a, 43b, and 43c depicted in FIG. 3 are mere examples, and the number, disposed positions, and shapes may be selected as appropriate by design without being limited to the illustrated configuration.

The metal plate 44 is made of a metal with superior thermal conductivity. Example materials include copper, aluminum, or an alloy containing at least one of these metals. To improve corrosion resistance, the surface of the metal plate 44 may be subjected to plating or the like using a material such as nickel. As specific examples, aside from nickel, nickel-phosphorus alloy or nickel-boron alloy may be used.

As one example, this insulated circuit board 41 may be formed as described below. First, the metal plate 44, the insulating plate 42, and the conductive plate are laminated in that order, and are bonded together by heating and the application of pressure in the stacking direction. Such pressure bonding is performed in an activated gas atmosphere or in a vacuum. After this, the conductive plate is masked with a photosensitive resist mask in keeping with predetermined patterns, etching is performed to form patterns, and the photosensitive resist mask is then removed to form the conductive circuit patterns 43a, 43b, and 43c.

The lead frames 45a, 45b, 45c, and 45d are made of a material with superior electrical conductivity. Example materials include copper, aluminum, and an alloy containing at least one of these metals. To improve corrosion resistance, the surfaces of the lead frames 45a, 45b, 45c, and 45d may be subjected to a plating process or the like using a material such as nickel. As specific examples, aside from nickel, nickel-phosphorus alloy and nickel-boron alloy may be used. The lead frames 45a, 45b, 45c, and 45d may each include a joint portion for joining to the semiconductor chips 46a, 46b, 46c, and 46d, a joint portion for joining to the conductive circuit patterns 43a and 43c, and a wiring portion that connects each pair of joint portions so that these portions are integrally combined. The joint portions of the lead frames 45a, 45b, 45c, and 45d for joining to the corresponding semiconductor chips 46a, 46b, 46c, and 46d are joined via joining members to negative electrodes on the front surfaces of the semiconductor chips. The joint portions of the lead frames 45a, 45b, 45c, and 45d for joining to the corresponding conductive circuit patterns 43a and 43c are joined via joining members to the conductive circuit patterns 43a and 43c. The wiring portions electrically connect the joint portions on the semiconductor chip sides to the joint portions on the conductive circuit pattern sides. Note that each wiring portion is positioned in parallel to the front surface of the insulated circuit board 41.

The semiconductor chips 46a, 46b, 46c, and 46d are power devices made of silicon. The semiconductor chips 46a, 46b, 46c, and 46d are reverse conducting-insulated gate bipolar transistors (RC-IGBTs). An RC-IGBT is a single chip that combines an IGBT, which is a switching element, and a free wheeling diode (FWD), which is a diode element. As one example, the semiconductor chips 46a, 46b, 46c, and 46d each have a collector electrode (positive electrode) as a main electrode on the rear surface and a gate electrode (control electrode) and an emitter electrode (negative electrode) as main electrodes on the front surface. Alternatively, the two semiconductor chips 46a and 46b (or the two semiconductor chips 46c and 46d) may each include a switching element and a diode element. In this case, the switching element is a power metal-oxide-semiconductor field-effect transistor (or "power MOSFET"), an IGBT, or the like. As one example, such semiconductor chips 46a and 46b (or semiconductor chips 46c and 46d) each have a drain electrode (or "positive electrode" or "collector electrode" in an IGBT) as a main electrode on the rear surface and a gate electrode (or "control electrode") and a source electrode (or "negative electrode" or "emitter electrode" in an IGBT) as main electrodes on the front surface. The diode element is an FWD, such as a Schottky barrier diode (SBD) or a P-intrinsic-N (PiN) diode. Alternatively, the semiconductor chips 46a, 46b, 46c, and 46d may be power MOSFETs that have silicon carbide as a main component. In a power MOSFET, a body diode may function as an FWD. As an example configuration, these semiconductor chips 46a, 46b, 46c, and 46d each have an input electrode (drain electrode) as a main electrode on the rear surface and an output electrode (source electrode) and a control electrode (gate electrode) as main electrodes on the front surface. These semiconductor chips 46a and 46b (or the semiconductor chips 46c and 46d) each have a cathode electrode as a main electrode on the rear surface and an anode electrode as a main electrode on the front surface. Rear surfaces of the semiconductor chips 46a, 46b, 46c, and 46d are bonded with a bonding material to the conductive circuit patterns 43a and 43c. The bonding material may be solder or sintered material. The solder is made of lead-free solder that contains a specified alloy as a main component. As examples, this specified alloy is at least one of an alloy of tin-silver-copper, an alloy of tin-zinc-bismuth, an alloy of tin-copper, and an alloy of tin-silver-indium-bismuth. The solder may also contain additives, such as nickel, germanium, cobalt, or silicon. In addition, examples of the sintered material when bonding by sintering include powdered forms of silver, iron, copper, aluminum, titanium, nickel, tungsten, and molybdenum. Note that the illustrated example is a case where a set of semiconductor chips 46a, 46b, 46c, and 46d are disposed on the insulated circuit board 41 depicted in FIG. 3. This is merely one example, and a plurality of sets of semiconductor chips may be disposed as appropriate for the design.

Figure 4:
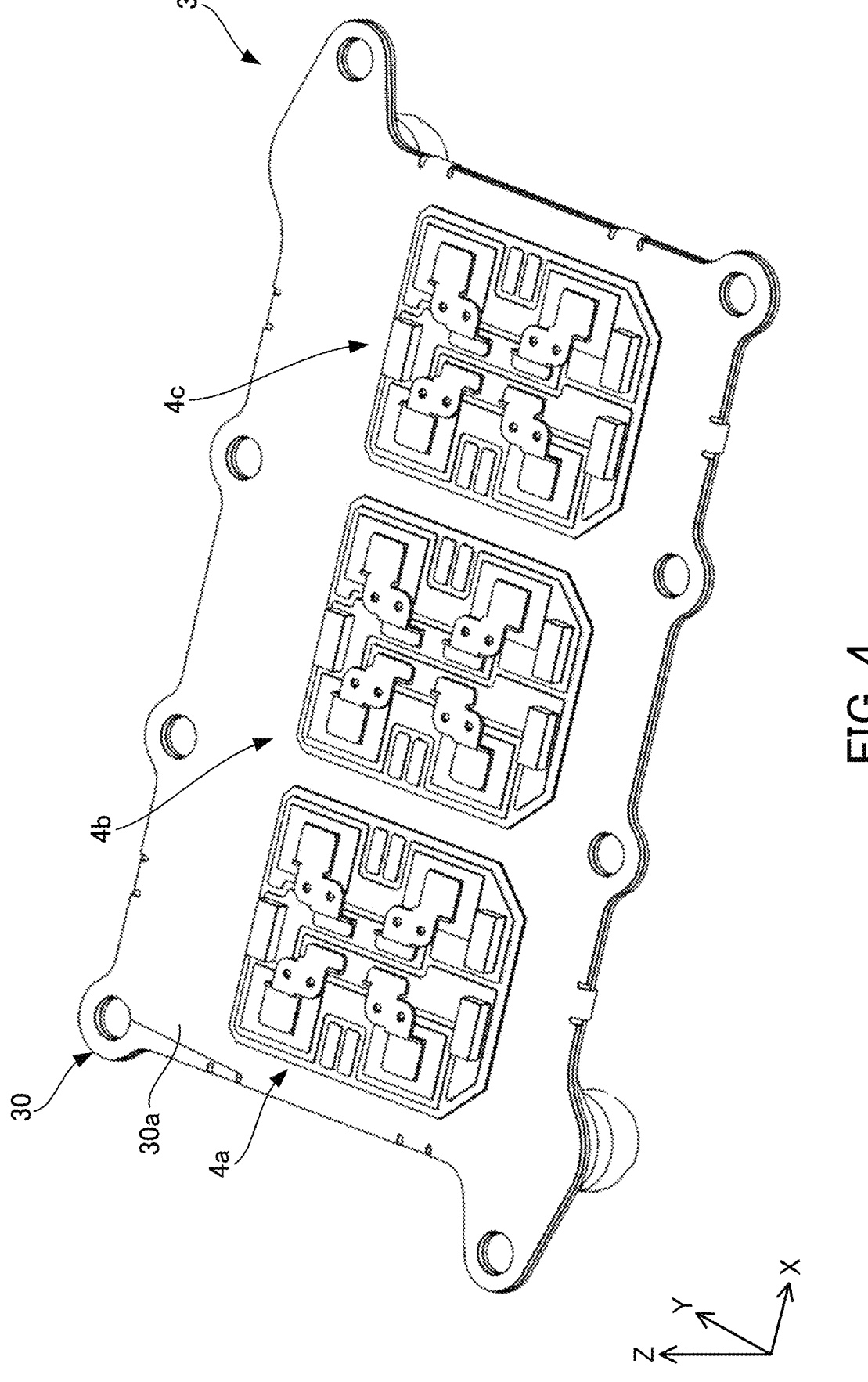
FIG. 4 is a perspective view of the cooling unit on which semiconductor units are placed.

FIG. 4 is a perspective view of the cooling unit on which the semiconductor units are placed. The cooling unit 3 includes a top plate 30 that is formed as a flat plate and is substantially rectangular in plan view. The top plate 30 of the cooling unit 3 is rectangular in plan view and has a larger area than the combined area of the housing areas 27a, 27b, and 27c of the case 2. The top plate 30 of this cooling unit 3 is made of a metal with superior thermal conductivity. Example materials include aluminum, iron, silver, copper, or an alloy containing at least one of these metals. Example alloys include metal composites such as aluminum-silicon nitride (Al—SiC) and magnesium-silicon nitride (Mg—SiC). To improve corrosion resistance, a material such as nickel may be formed on the surface of the top plate 30 by plating or the like. Aside from nickel, example plating materials include nickel-phosphorus alloy and nickel-boron alloy. Note that the top plate 30 may be substantially rectangular, mounting holes for inserting screws may be formed at the corners and along the sides of the top plate 30 as depicted in FIG. 4, or a part with mounting holes may also be provided.

The cooling unit 3 may include a plurality of fins formed on an opposite surface to the cooling surface 30a of the top plate 30, and a housing that houses the plurality of fins and is provided on the opposite surface-side of the cooling surface 30a. In this type of cooling unit 3, which is referred to as "closed fins", refrigerant is circulated inside the housing to cool the semiconductor units 4 on the top plate 30. Alternatively, the cooling unit 3 may include a plurality of fins formed on the opposite surface of the top plate 30 to the cooling surface 30a without including a housing. In this type of cooling unit 3, which is referred to as "open fins", air passes between the plurality of fins to cool the semiconductor units 4 on the top plate 30.

The semiconductor units 4a, 4b, and 4c are disposed via a bonding member on the top plate 30 of the cooling unit 3 so as to respectively correspond to the housing areas 27a, 27b, and 27c. As examples, the bonding member (not illustrated) may be solder, brazing material, or thermal interface material (TIM). Lead-free solder is used as the solder. The brazing material has at least one of an aluminum alloy, a titanium alloy, a magnesium alloy, a zirconium alloy, and a silicon alloy as a main component. As examples, the TIM is an elastomer sheet, room temperature vulcanization (RTV) rubber, gel, or a phase change material. The case 2 is disposed on the top plate 30 on which the semiconductor units 4a, 4b, and 4c are disposed so that the semiconductor units 4a, 4b, and 4c are housed in the housing areas 27a, 27c, and 27b. Note that the case 2 is bonded to the top plate 30 with a specified adhesive.

For the semiconductor unit 4a housed in the housing area 27a, the internal terminal 23a1 is electrically connected to the conductive circuit pattern 43b via a block, not illustrated. The internal connector portion 22a1 is also electrically connected to the conductive circuit pattern 43c via a block. In addition, the U connector portion 24a1 is electrically connected to the conductive circuit pattern 43a via a block. In the same way, for the semiconductor unit 4b housed in the housing area 27b, the internal terminal 23b1 is electrically connected to the conductive circuit pattern 43b via a block. The internal connector portion 22b1 is electrically connected to the conductive circuit pattern 43c via a block. In addition, the V connector portion 24b1 is electrically connected to the conductive circuit pattern 43a via a block. In the same way, for the semiconductor unit 4c housed in the housing area 27c, the internal terminal 23c1 is electrically connected to the conductive circuit pattern 43b via a block. The internal connector portion 22c1 is electrically connected to the conductive circuit pattern 43c via a block. In addition, the W connector portion 24c1 is electrically connected to the conductive circuit pattern 43a via a block. Note that the blocks are made of a material with superior electrical conductivity. As examples, this material may be copper, aluminum, or an alloy containing at least one of these metals. The thicknesses of the blocks correspond to the gaps between the connector portions and the circuit patterns. To improve corrosion resistance, a material such as nickel may be formed on the surface of the blocks by a plating process or the like. Aside from nickel, specific examples of the plating material, nickel-phosphorus alloy, and nickel-boron alloy.

Figure 5:
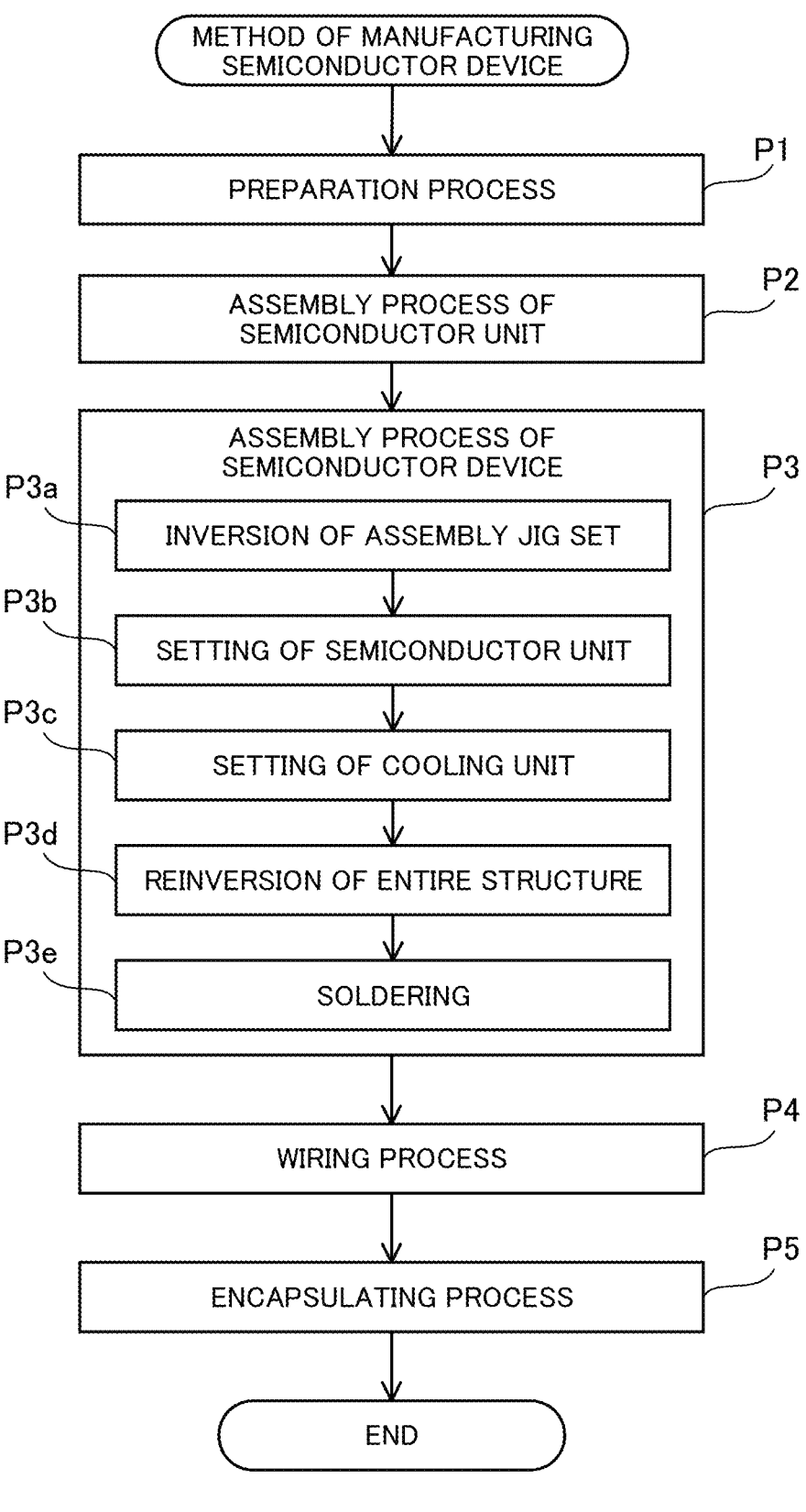
FIG. 5 is a flowchart depicting a method of manufacturing a semiconductor device according to an embodiment of the present disclosure.

Next, a method of manufacturing the semiconductor device 1 described above will be described with reference to FIG. 5. FIG. 5 is a flowchart depicting a method of manufacturing a semiconductor device according to the present embodiment. First, a preparation process P1 that prepares the components used in the semiconductor device 1 is performed. Semiconductor chips, insulated circuit boards, the case 2, raw material for the encapsulating members, lead frames, and the cooling unit 3 including the top plate 30 are prepared in this preparation process P1 as examples of the components to be used.

Next, an assembly process P2 for assembling the semiconductor units 4a, 4b, and 4c is performed. In this assembly process P2, first, semiconductor chips 46a, 46b, 46c, and 46d are disposed at predetermined locations on the conductive circuit patterns 43a and 43c on the insulated circuit boards 41 via solder plates for example, and lead frames 45a, 45b, 45c, and 45d are disposed in the same way via solder plates. Next, the solder plates are heated so as to melt and then cooled, which bonds the semiconductor chips 46a, 46b, 46c, and 46d and the lead frames 45a, 45b, 45c, and 45d to the insulated circuit board 41 with solder as the bonding material, thereby assembling the semiconductor units 4a, 4b, and 4c that have the same structure as the semiconductor unit 4 depicted in FIG. 4. In addition, on the insulated circuit boards the 41, linear expansion coefficient of the insulating plate 42 is lower than the linear expansion coefficients of the conductive circuit patterns 43a, 43b, and 43c formed on the insulating plate 42 and of the metal plate 44. In addition, the metal plate 44 formed on the rear surface of the insulating plate 42 has a larger volume than the conductive circuit patterns 43a, 43b, and 43c formed on the front surface of the insulating plate 42. This means that due to the heating and cooling performed in the assembly process P2, the insulated circuit board 41 included in each semiconductor unit 4 will warp downward with the rear surface of the insulating plate 42 as "down".

Next, an assembly process P3 of the semiconductor device 1 is performed. The assembly process P3 is a process for attaching the semiconductor units 4a, 4b, and 4c to the cooling unit 3 and housing the semiconductor units 4a, 4b, and 4c provided on the cooling unit 3 inside the case 2. The assembly process P3 includes a process P3a of inverting an assembly jig set, a process P3b of setting the semiconductor units, a process P3c of setting the cooling unit 3, a process P3d of reinverting the entire structure, and a process P3e of soldering together the semiconductor units and the cooling surface 30a of the cooling unit 3. The processes P3a, P3b, P3c, P3d, and P3e will be described in detail later.

Next, a wiring process P4 where the semiconductor units 4a, 4b, and 4c housed in the case 2 and the printed circuit boards 26a, 26b, and 26c are wired with bonding wires is performed.

An encapsulating process P5 is performed where the housing areas 27a, 27b, and 27c of the case 2 are filled with the raw material for the encapsulating members and then encapsulated with the encapsulating members 28a, 28b, and 28c.

Figure 6:
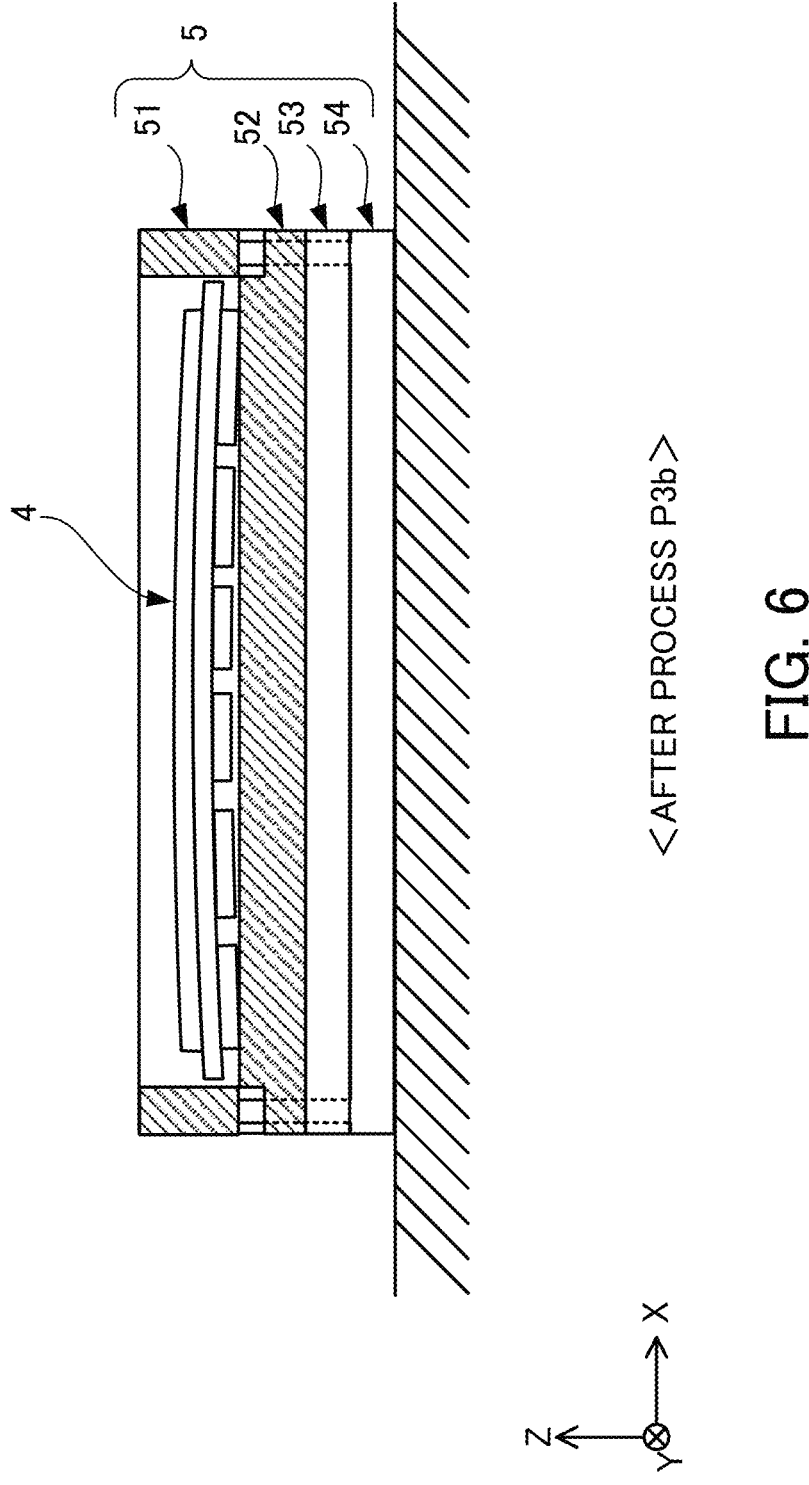
FIG. 6 is a diagram useful in explaining an assembly process of the semiconductor device (that is, setting of semiconductor units) included in the method of manufacturing a semiconductor device according to the present embodiment.

Next, the process P3a for inverting the assembly jig set and the process P3b for setting the semiconductor units will be described in more detail. FIG. 6 is a diagram useful in explaining the assembly process of the semiconductor device (that is, setting of the semiconductor units) included in the method of manufacturing semiconductor device according to the present embodiment.

In the process P3a, the assembly jig set 5 is set and then inverted. In the assembly jig set 5, a positioning jig 51, a height control jig 52, a height control weight 53, and a positioning weight 54 are set in that order from the bottom. These individual jigs will be described later. The assembly jig set 5 that has been set in this way is then inverted so that the positioning jig 51 becomes positioned at the top.

The process P3b uses the assembly jig set 5 that was inverted in the process P3a. FIG. 6 depicts the assembly jig set 5 and the semiconductor units 4 that have been set in the assembly jig set 5 after the process P3b. The inverted assembly jig set 5 includes, from the top, the positioning jig 51, the height control jig 52, the height control weight 53, and the positioning weight 54. It is desirable for the positioning jig 51 and the height control jig 52 to be made of a material, such as a carbon material, which is heat-resistant and has a low linear expansion coefficient. The height control weight 53 and the positioning weight 54 are made of a material that is heavier than the positioning jig 51 and the height control jig 52.

The positioning jig 51 is a jig for positioning a semiconductor unit 4 with respect to the top plate 30. That is, the positioning jig 51 determines the positions of the semiconductor units 4a, 4b, and 4c on the top plate 30 so that the semiconductor units 4a, 4b, and 4c are positioned corresponding to the housing areas 27a, 27b, and 27c, respectively. The positioning jig 51 may be rectangular in plan view, and may also be formed in a frame-shape including a fixing area 51a that is an opening whose shape corresponds to the outer shape of a semiconductor unit 4 (see FIG. 9 described later). The positioning jig 51 may be formed so that recesses into which guides of a positioning weight 54 (described later) fit are formed at positions corresponding to the guides.

The height control jig 52 is a jig that controls the height of a semiconductor unit 4 by pressing the semiconductor unit 4 from above (that is, the semiconductor chips 46a, 46b, 46c, 46d side) to below (that is, the metal plate 44 side). In plan view, the height control jig 52 may have the same external shape as the positioning jig 51. The height control jig 52 is also equipped with a control part 52a including a pressing surface 52b that presses the upper side of a semiconductor unit 4 in this manner (see FIG. 8 described later). As one example, the control part 52a may correspond to the shape of the opening in the fixing area 51a of the positioning jig 51 in plan view. The height control jig 52 may be formed with through holes, through which guides of a positioning weight 54 (described later) are inserted, at positions corresponding to the guides. As described earlier, the entire assembly jig set 5 is depicted in an inverted state in FIG. 6.

The height control weight 53 is a weight that applies a load to the height control jig 52.

The positioning weight 54 is a weight that applies a load to the positioning jig 51.

As one example, the positioning weight 54 and the positioning jig 51 are connected by guides. The clearance between the jigs, which will be described later, may be maintained in keeping with the length of these guides. The positioning weight 54 is able to directly load the positioning jig 51 via these guides. The height control weight 53 and the height control jig 52 are inserted onto these guides between the positioning weight 54 and the positioning jig 51. The height control weight 53 is able to directly load the height control jig 52 along the guides.

Figure 7:
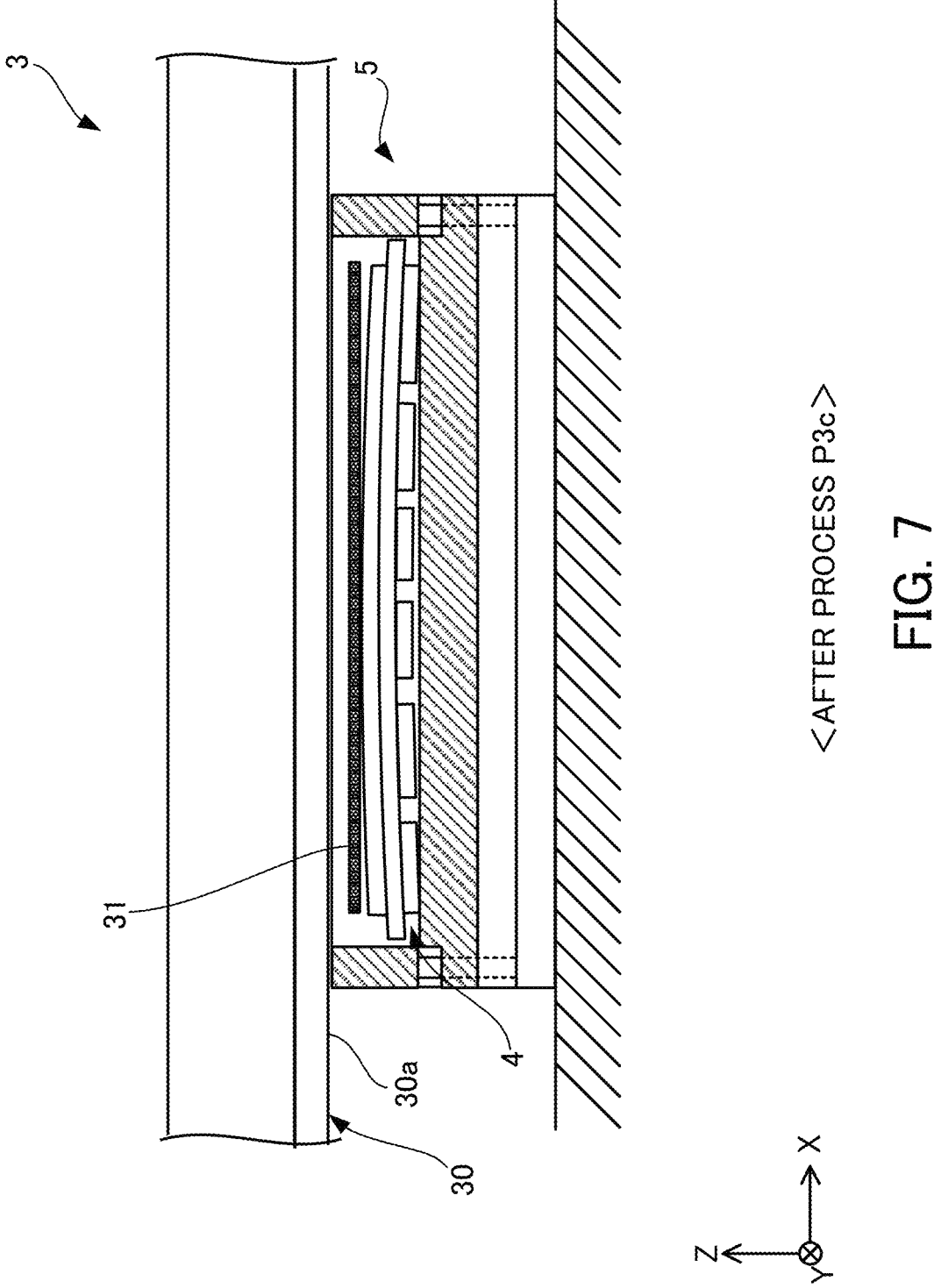
FIG. 7 is a diagram useful in explaining an assembly process (that is, setting of a cooling unit) of a semiconductor device included in the method of manufacturing a semiconductor device according to the present embodiment.

The process P3*c*, which sets the cooling unit 3 will be described in detail next. FIG. 7 is a diagram useful in explaining an assembly process (that is, setting the cooling unit) of a semiconductor device included in the method of manufacturing a semiconductor device according to the present embodiment.

In the process P3*c*, the solder 31 that has solidified into plate shapes is placed on the rear surface (or metal plate 44) side (the upper side in FIG. 7) of a semiconductor unit 4, and the cooling unit 3 is placed on the upper side of the inverted assembly jig set 5 so that the cooling surface 30*a* of the top plate 30 of the cooling unit 3 faces downward. This cooling surface 30*a* may also be referred to as a "placement surface".

Figure 8:
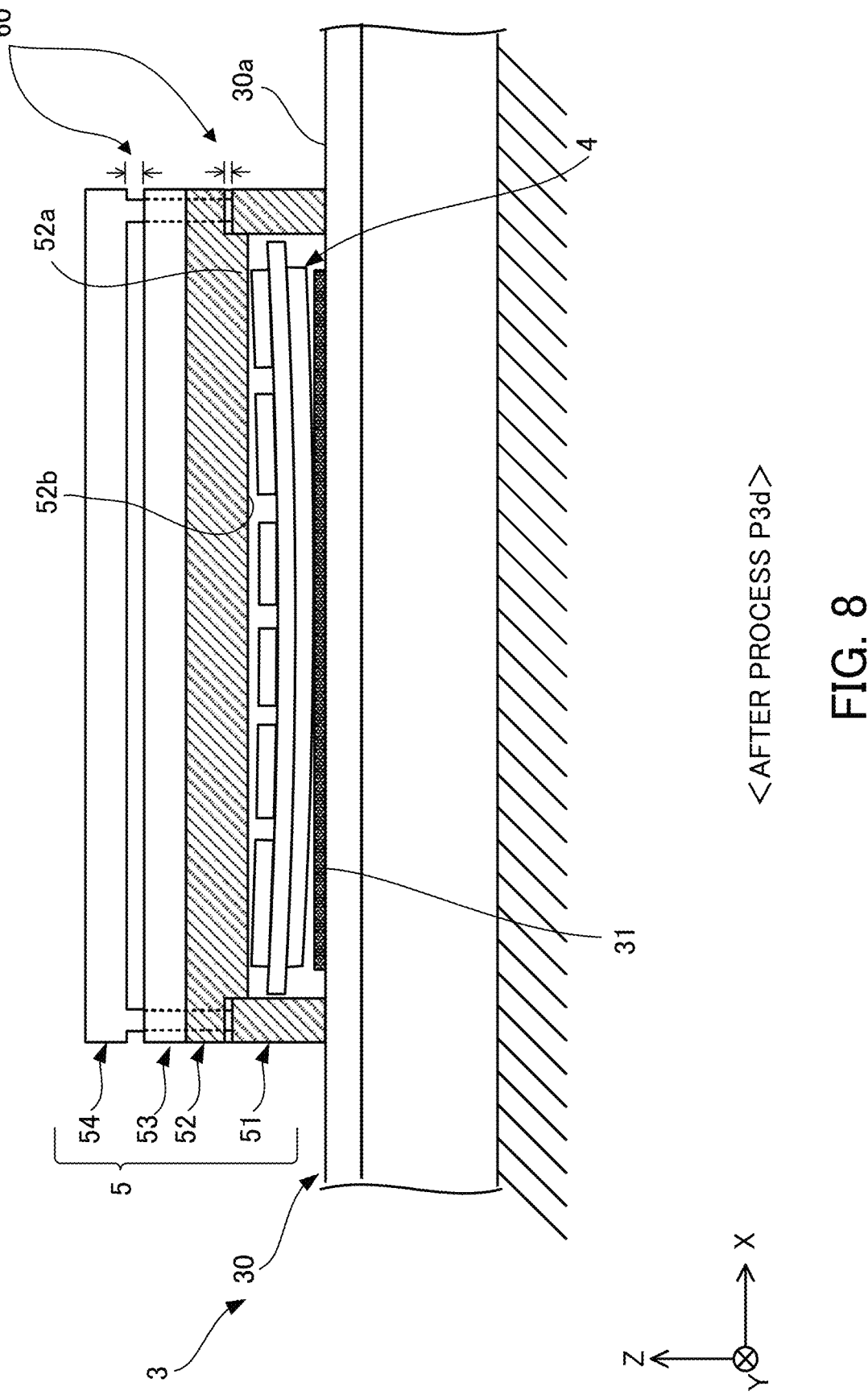
FIG. 8 is a diagram useful in explaining an assembly process (that is, reinverting the entire structure) of a semiconductor device included in the method of manufacturing a semiconductor device according to the present embodiment.

Next, the process P3*d* of reinverting the entire structure will be described in detail. FIG. 8 is a diagram useful in explaining the assembly process (that is, reinverting the entire structure) of a semiconductor device included in the method of manufacturing a semiconductor device according to the present embodiment.

In the process P3*d*, the entire structure including the assembly jig set 5 and the cooling unit 3 is vertically inverted from the state after the process P3*c*. A semiconductor unit 4 is then disposed via the solder 31 on the cooling surface 30*a* of the top plate 30. At this time, the installed position of the semiconductor unit 4 with respect to the cooling surface 30*a* is fixed by the positioning jig 51 and the positioning weight 54. The height control jig 52 is subjected to the load of the height control weight 53 and moves downward along the guides. The control part 52*a* of the height control jig 52 then comes into contact with the semiconductor unit 4 at a pressing surface 52*b*, which is the lower end of the control part 52*a*. That is, the pressing surface 52*b* of the control part 52*a* comes into contact with the parts of the semiconductor unit 4 that have risen above the cooling surface 30*a* due to warping. The height control jig 52 is able to control the height of the semiconductor unit 4 by pressing the semiconductor unit 4 downward with the pressing surface 52*b* that is loaded with the height control weight 53. This controlling of height by the height control jig 52 will be described later.

Here, as depicted in FIG. 8, the thickness of the control part 52*a* of the height control jig 52 is greater than the thickness of the part of the height control jig 52 through which the guides are inserted, and the pressing surface 52*b* may be positioned below the upper surface of the positioning jig 51.

Note that the amount of clearance 60, which is a gap provided to allow the height control jig 52 to move up and down along the guides, is set at a length capable of absorbing variations in the warping of a semiconductor unit 4. The amount of clearance 60 is equal to or greater than 0.60 mm and equal to or less than 0.70 mm, and as one example is 0.65 mm.

Figure 9:
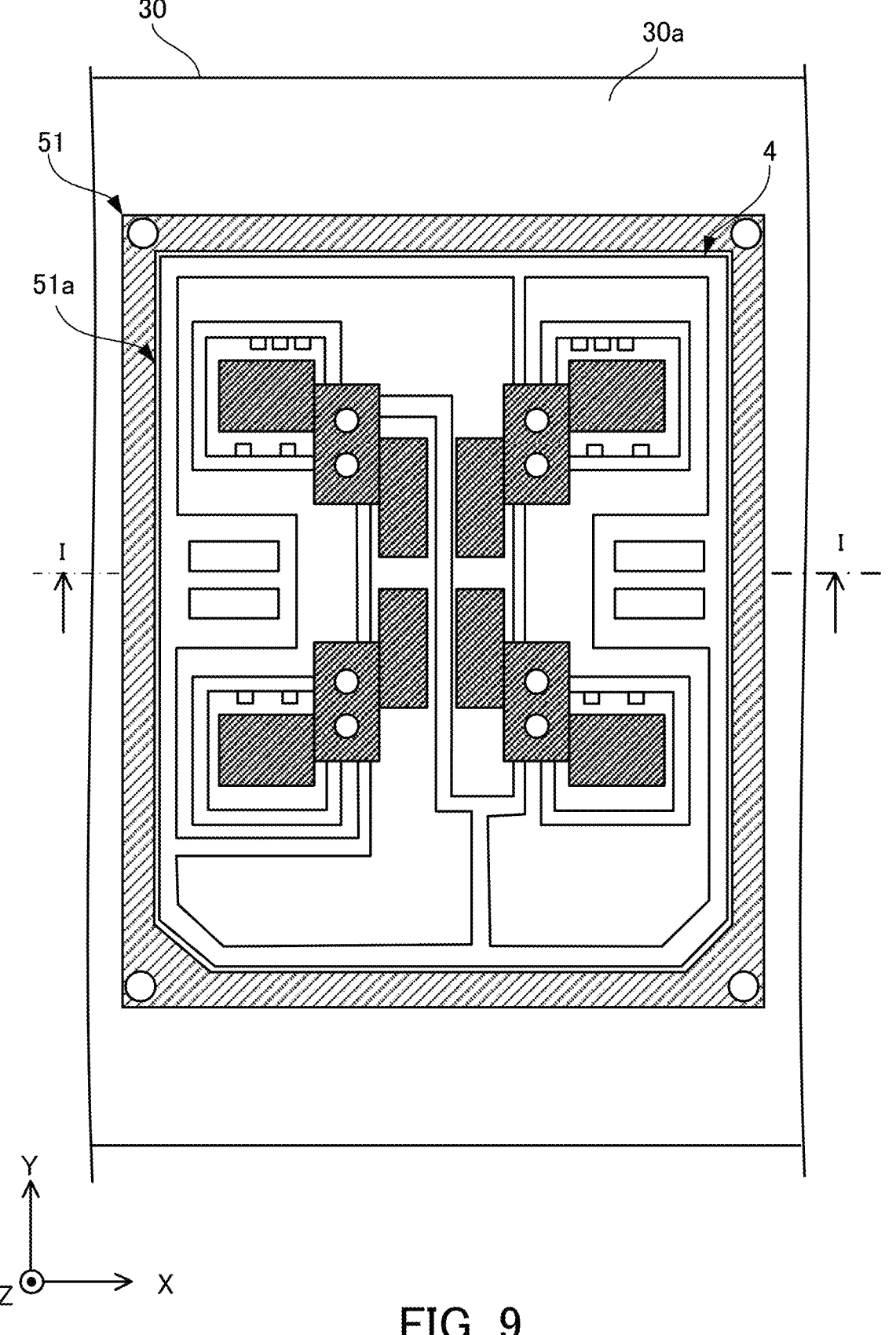
FIG. 9 is a plan view of a positioning jig used in the assembly process of a semiconductor device included in the method of manufacturing a semiconductor device according to the present embodiment.

FIG. 9 is a plan view of a positioning jig used in the assembly process of a semiconductor device included in the method of manufacturing a semiconductor device according to the present embodiment. In FIG. 9, the positioning jig 51 that has been disposed on the cooling unit 3 as depicted in FIG. 8 is depicted when looking from above to below along the Z axis. Note that illustration of the height control jig 52, the height control weight 53, and the positioning weight 54 has been omitted from FIG. 9. The positioning jig 51 is a rectangular frame with the fixing area 51*a* that corresponds to the shape of a semiconductor unit 4. The semiconductor unit 4 may fit into the fixing area 51*a*. This fixing area 51*a* may also be referred to as the "opening area". As one example, recesses in which guides are provided may be formed at the four corners of the positioning jig 51. Cross-sectional views taken along a line I-I in FIG. 9 correspond to FIGS. 6 to 8.

Figure 10:
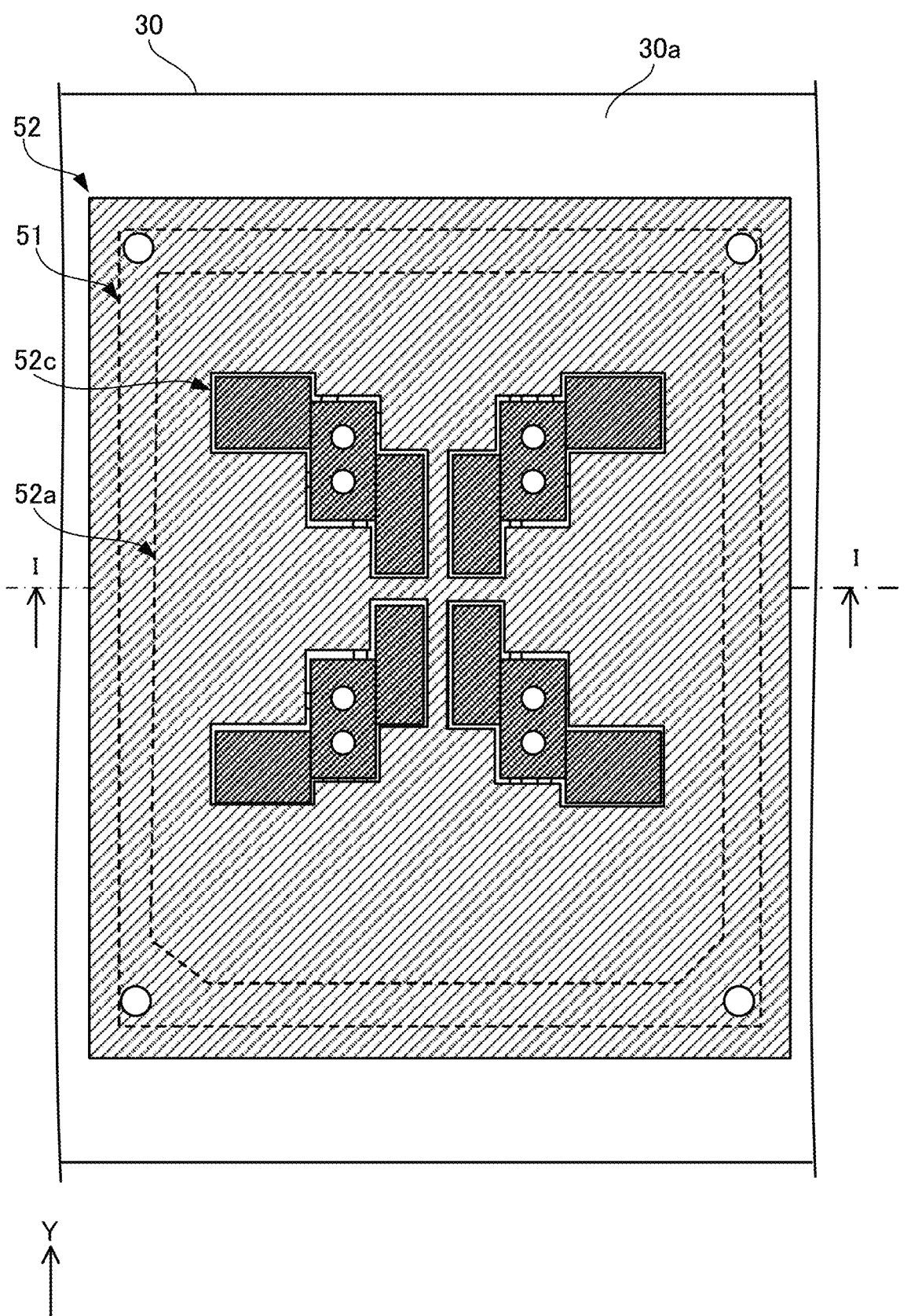
FIG. 10 is a plan view of a height control jig used in the assembly process of a semiconductor device included in the method of manufacturing a semiconductor device according to the present embodiment.

FIG. 10 is a plan view of a height control jig used in the assembly process of a semiconductor device included in the method of manufacturing a semiconductor device according to the present embodiment. FIG. 10 depicts the height control jig 52 disposed on the cooling unit 3 as depicted in FIG. 8 when looking from above to below along the Z axis. Note that illustration of the height control weight 53 and the positioning weight 54 has been omitted from FIG. 10.

As depicted in FIG. 10, the area of the height control jig 52 in plan view may be larger than the area of the positioning jig 51 in plan view. Also, the control part 52*a* is formed in the shape of the fixing area 51*a* of the positioning jig 51 in plan view. The height control jig 52 may also include housing portions 52*c* at positions corresponding to the lead frames 45*a*, 45*b*, 45*c*, and 45*d*. These housing portions 52*c* house the lead frames 45*a*, 45*b*, 45*c*, and 45*d*. When the semiconductor units 4 are pressed from above by the height control jig 52, by having the lead frames 45*a*, 45*b*, 45*c*, and 45*d* housed in the housing portions 52*c*, it is possible for the height control jig 52 to appropriately apply the load of the height control weight 53 to the insulated circuit board 41. This means that the height control jig 52 is able to appropriately control the height of the insulated circuit board 41.

Figures 11A, 11B, 11C:
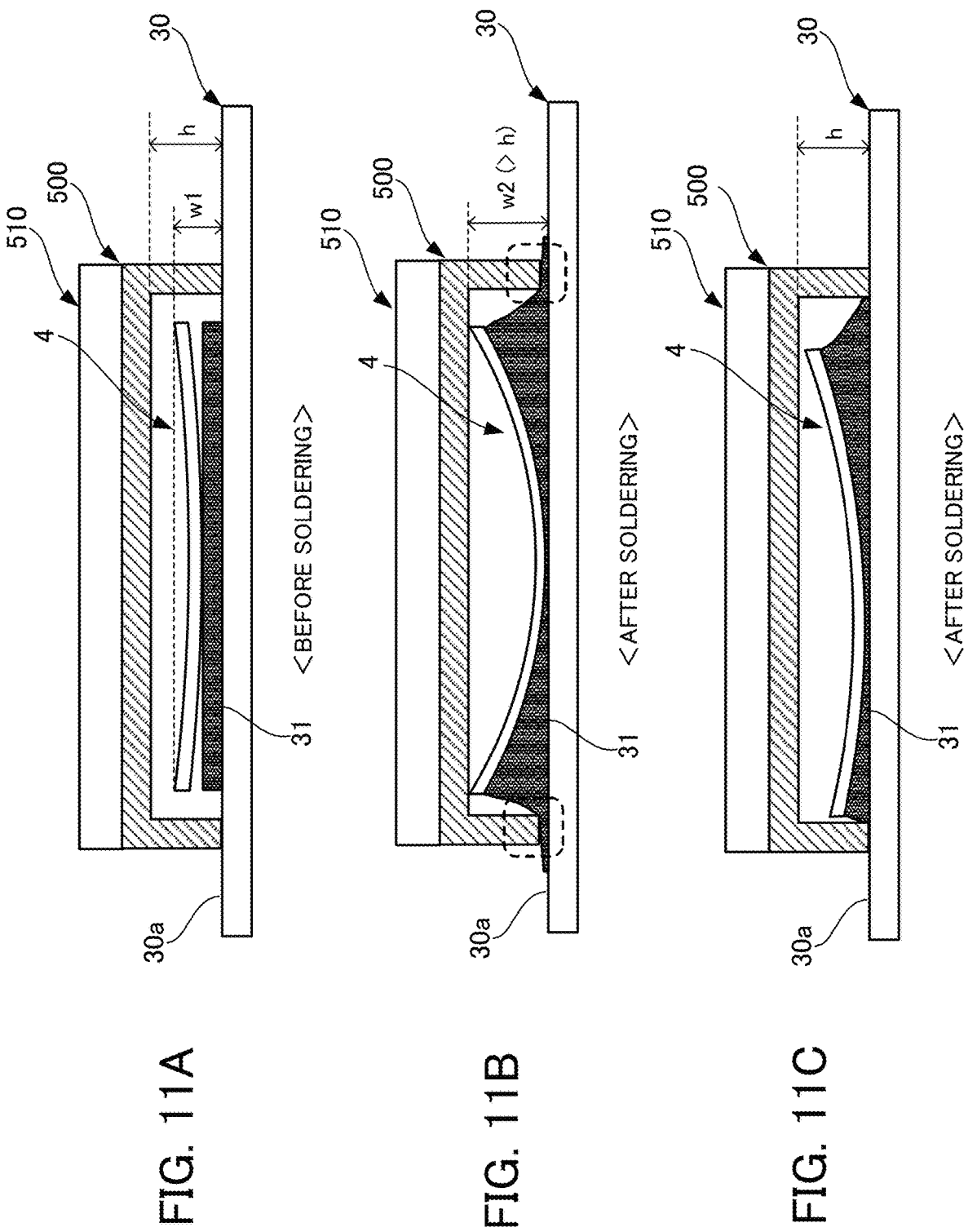
FIGS. 11A to 11C are diagrams useful in explaining an assembly process (that is, soldering) of a semiconductor device included in a comparative example of a method of manufacturing a semiconductor device.

Here, another method of manufacturing a semiconductor device will be described as a comparative example. FIGS. 11A to 11C are diagrams useful in explaining an assembly process (that is, soldering) of a semiconductor device included in this comparative example of a method of manufacturing a semiconductor device. Note that in FIGS. 11A to 11C, the semiconductor unit 4 is depicted with a simplified form. In this comparative example, when performing the assembly process P3 for a semiconductor device, the assembly jig set 5 according to the present embodiment is not used, and an inner frame jig 500 that is integrally formed from a carbon material or the like is used instead as a positioning jig. The inner frame jig 500 includes four side walls that surround the sides of a space in which a semiconductor unit 4 is disposed, and a ceiling portion that covers the upper side of this space, on a predetermined region on the cooling surface 30*a* of the top plate 30. In addition, a weight 510 is placed on the upper side of the inner frame jig 500.

In the assembly process P3 of this comparative example, the semiconductor unit 4 is set via the solder 31, which has solidified in plate form, on the cooling surface 30*a* of the cooling unit 3. The inner frame jig 500 is then set on the cooling surface 30*a* to cover the semiconductor unit 4, and the process P3*e* is performed. When the insulated circuit board 41 of the semiconductor unit 4 is bonded to the cooling surface 30*a* of the cooling unit 3 using the solder 31 in the process P3*e*, warping of the insulated circuit board 41 may occur due to heating. Here, FIG. 11A depicts a warping amount w1 and height h of the semiconductor unit 4 before the semiconductor unit 4 and the top plate 30 are bonded using the solder 31. The warping amount w1 of the semiconductor unit 4 used here is the maximum value out of the heights of respective points on the upper surface of the semiconductor unit 4 from the cooling surface 30*a*. The warping amount w1 of the semiconductor unit 4 may also be referred to as the warping amount of the insulated circuit board 41. The warping amount of the semiconductor unit 4 corresponds to the height of the semiconductor unit 4 or the height of the insulated circuit board 41. The height h is the length from the cooling surface 30*a* to the ceiling of the inner frame jig 500 when the inner frame jig 500 has been placed on the cooling surface 30*a*. In the example in FIG. 11A, w1<h.

The amount of thermal warping will vary depending on the individual insulated circuit board 41. For this reason, if an inner frame jig 500 with fixed dimensions is used for different insulated circuit boards 41, the following problems may occur.

FIG. 11B depicts an example where a warping amount w2 of the semiconductor unit 4 (or the insulated circuit board 41) is greater than the height h (that is, w2>h). When w2>h, the inner frame jig 500 is lifted by the warping of the semiconductor unit 4, which creates a gap between the inner frame jig 500 and the cooling surface 30*a*. When this happens, melted solder 31 flows out of the inner frame jig 500 through the gap. Due to this, there is increased likelihood that the thickness of the solder 31 will not be sufficiently maintained on a localized level, resulting in a drop in the heat dissipation performance of the semiconductor unit 4. In addition, there is an increased likelihood of solder 31 that has flowed out adhering to the surrounding area.

FIG. 11C depicts an example where a warping amount w3 of the semiconductor unit 4 (or the insulated circuit board 41) is smaller than the height h (w3<h). When w3<h, a gap (with the gap dimension=h−w3) will be produced between the inside of the inner frame jig 500 and the semiconductor unit 4 (the insulated circuit board 41). This causes the semiconductor unit 4 (the insulated circuit board 41) to tilt (that is, there is play between the insulated circuit board 41 and the inner frame jig 500), which produces variations in the thickness of the solder 31 (or simply "solder thickness") used for bonding. Due to this, variation is produced in the heat dissipation performance of the semiconductor unit 4, which ultimately increases the likelihood of a drop in the heat dissipation performance of the semiconductor unit 4.

In this way, the inner frame jig 500 whose dimensions are fixed is incapable of conforming to the variations in the thermal warping of the insulated circuit board 41.

For this reason, in the method of manufacturing the semiconductor device 1 according to the present embodiment (and in particular, the process P3*e*), as depicted in FIG. 8, by using two separate jigs, namely, the positioning jig 51 and the height control jig 52, in place of the inner frame jig 500, it is possible to conform to variations in thermal warping of the insulated circuit board 41. By using the assembly jig set 5 including the positioning jig 51 and the height control jig 52, a jig structure capable of conforming to variations in the thermal warping of the insulated circuit board 41 is realized.

The positioning jig 51 positions the semiconductor unit 4 (the insulated circuit board 41) and suppresses the solder from flowing. The height control jig 52 controls the height of the semiconductor unit 4 (the insulated circuit board 41) by being loaded with the height control weight 53. In addition, by dividing the weight into two, that is, using the height control weight 53 and the positioning weight 54, in place of using a single weight, the positioning jig 51 will be loaded by the positioning weight 54, which favorably suppresses the creation of gaps between the cooling surface 30*a* and the positioning jig 51.

In this way, by using the assembly jig set 5 which includes the positioning jig 51 and the height control jig 52, it is possible to realize a jig structure that may absorb variations in thermal warping of the insulated circuit board 41. By doing so, the flowing of solder under the insulated circuit board 41 is reduced and variations in the solder thickness under the insulated circuit board 41 are also reduced.

As one example, when the warping of the insulated circuit board 41 is comparatively large, the positioning jig 51 will come into contact with the cooling surface 30*a*, so that no gaps are created. The positioning weight 54 is able to directly load the positioning jig 51 via guides. This means that it is possible to reduce the possibility of gaps being produced between the positioning jig 51 and the cooling surface 30*a*, which reduces defects due to solder flow.

Also, when the warping of the insulated circuit board 41 is comparatively small, the height control jig 52 will come into contact with the semiconductor unit 4 (the insulated circuit board 41), which enables the height control jig 52 to apply a load to the semiconductor unit 4 (the insulated circuit board 41) with the height control weight 53. This means that tilting (that is, differences in the height of the outer periphery) of the semiconductor unit 4 (the insulated circuit board 41) are suppressed and variation in the solder thickness is reduced.

As described above, the method of manufacturing the semiconductor device 1 includes, as examples, a preparation process, a positioning process, and a height control process. The preparation process is a process of preparing the insulated circuit board 41 and the cooling unit 3 including the cooling surface 30*a*. The positioning process is a process of housing the entire insulated circuit board 41 via a bonding member on the cooling surface 30*a* of the cooling unit 3 via the fixing area 51*a*, which is an opening corresponding to the size of the insulated circuit board 41 in plan view, of the positioning jig 51 disposed on the cooling surface 30*a* of the cooling unit 3. As one example, the bonding member is the solder 31. The height control process is a process where during pressing of the positioning jig 51 onto the cooling surface 30*a*, a pressing surface at the lower end of the control part 52*a*, whose shape is included within the fixing area 51*a* of the positioning jig 51 in plan view, included in the height control jig 52 presses the upper surface of the insulated circuit board 41 toward the cooling surface 30*a* through the fixing area 51*a*. By doing so, it is possible to reduce the influence of variations in the thermal warping of the insulated circuit board 41.

As one example, the height control process includes pressing a height control jig 52 against the cooling surface 30*a* separately to the positioning jig 51. By doing so, the height of the insulated circuit board 41 is appropriately controlled, which reduces variations in the solder thickness and reduces a drop in the heat dissipation performance of the semiconductor unit 4.

The height control process also includes disposing a positioning weight (the positioning weight 54) on the positioning jig 51 to apply a load to the cooling surface 30*a* using the positioning jig 51. By doing so, it is possible to suppress the creation of gaps between the positioning jig 51 and the cooling surface 30*a*, thereby reducing defects due to the solder flowing.

The height control process also includes placing a height control weight (the height control weight 53) on the height control jig 52 to load the cooling surface 30*a* using the height control jig 52. By doing so, the height of the insulated circuit board 41 is more appropriately controlled, resulting in reduced likelihood of a decrease in the heat dissipation performance of the semiconductor unit 4 due to variations in solder thickness.

The method of manufacturing a semiconductor device 1 may include, after the preparation process and before the positioning process, a substrate setting process, a cooling unit setting process, and a reinverting process that are described below.

The substrate setting process is a process of inverting the height control jig 52, setting the fixing area 51a of the positioning jig 51 on the control part 52a of the height control jig 52, and setting the upper surface of the insulated circuit board 41 on the pressing surface 52b of the control part 52a through the fixing area 51a of the positioning jig 51 set on the height control jig 52.

The cooling unit setting process is a process that sets a bonding member (the solder 31) on the lower surface of the insulated circuit board 41 (which faces upward due to the inversion) set on the pressing surface 52b of the height control jig 52, and sets the cooling surface 30a of the cooling unit 3 on the positioning jig 51 so as to cover the fixing area 51a.

The reinverting process is a process of further inverting the height control jig 52, the positioning jig 51, the insulated circuit board 41, and the cooling unit 3.

By doing so, it is possible to appropriately position the positioning jig 51 on the cooling surface 30a and to place the insulated circuit board 41 on the cooling surface 30a so that height control by the height control jig 52 is performed effectively. Accordingly, when the case 2 is attached to the cooling surface 30a on which the semiconductor units 4 (the insulated circuit boards 41) have been placed, the semiconductor units 4 may be reliably housed inside the housing areas 27a, 27b, and 27c of the case 2.

As described earlier, the assembly jig set 5 used to place the insulated circuit board 41 on the cooling surface 30a of the cooling unit 3 includes the positioning jig 51, the height control jig 52, and a positioning weight (the positioning weight 54). The positioning jig 51 is placed on the cooling surface 30a and includes a fixing area 51a that is an opening corresponding to the size of the insulated circuit board 41 in plan view, with the entire insulated circuit board 41 being housed via the bonding member on the cooling surface 30a through this fixing area 51a. The height control jig 52 includes the control part 52a with a shape that is included in the fixing area 51a of the positioning jig 51, and includes the pressing surface 52b, which presses the upper surface of the insulated circuit board 41 through the fixing area 51a toward the cooling surface 30a, at the lower end of the control part 52a. The positioning weight (the positioning weight 54) loads the positioning jig 51 toward the cooling surface 30a. By doing so, it is possible to reduce the influence of variations in thermal warping of the insulated circuit board 41 and to reduce the drop in the heat dissipation performance of the semiconductor unit 4 (the insulated circuit board 41).

The method of manufacturing a semiconductor device and the jig set described above are capable of reducing the influence of variations in thermal warping of an insulated circuit board, which makes it possible to suppress variations in solder flow and solder thickness.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A method of manufacturing a semiconductor device, comprising:

preparing an insulated circuit board having a first surface and a second surface opposite to each other, and a cooling unit including a cooling surface;

preparing a jig set including a positioning jig having an opening that corresponds to a size of the insulated circuit board in a plan view of the semiconductor device, to thereby define a fixing area for housing the insulated circuit board therein, and a height control jig including a control part shaped to be fitted into the fixing area of the positioning jig, the control part having, at a lower end thereof, a pressing surface;

housing the entire insulated circuit board in the fixing area of the positioning jig, setting a bonding member on the first surface of the insulated circuit board, and disposing the positioning jig on the cooling surface of the cooling unit; and pressing the height control jig to thereby press the second surface of the insulated circuit board housed in the fixing area toward the cooling surface, while pressing the positioning jig onto the cooling surface by applying a positioning weight onto the positioning jig.

2. The method of manufacturing a semiconductor device according to claim 1, wherein the pressing of the positioning jig and the pressing of the height control jig are separate from each other.

3. The method of manufacturing a semiconductor device according to claim 1, wherein the pressing of the positioning jig onto the cooling surface includes disposing a height control weight onto the height control jig, which in turn presses the height control jig onto the cooling surface.

4. The method of manufacturing a semiconductor device according to claim 1, further comprising, after preparing the insulated circuit board and the cooling unit, and before housing the entire insulated circuit board in the fixing area of the positioning jig:

inverting the height control jig;

setting the positioning jig and the height control jig by aligning the fixing area of the positioning jig with the control part of the height control jig, and placing the insulated circuit board in the fixing area to thereby set the second surface of the insulated circuit board on the pressing surface of the control part;

setting the bonding member on the first surface of the insulated circuit board, and setting the cooling surface of the cooling unit on the positioning jig to cover the fixing area; and subsequently inverting the height control jig again, with the positioning jig, the insulated circuit board, and the cooling unit set thereon.

5. A jig set for placing an insulated circuit board on a cooling surface of a cooling unit, the jig set comprising:

a positioning jig configured to be disposed on the cooling surface, the positioning jig having an opening corresponding to a size of the insulated circuit board in a plan view of the semiconductor device, to thereby define a fixing area for housing the entire insulated circuit board therein;

a height control jig including a control part shaped to be fitted into the fixing area of the positioning jig, the control part having, at a lower end thereof, a pressing surface for pressing an upper surface of the insulated circuit board located in the fixing area toward the cooling surface; and a positioning weight configured to apply, to the positioning jig, a pressure toward the cooling surface.

* * * * *